(12) United States Patent  
Savoj

(10) Patent No.: US 8,412,141 B2
(45) Date of Patent: Apr. 2, 2013

(54) LR POLYPHASE FILTER

(75) Inventor: Jafar Savoj, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 425 days.

(21) Appl. No.: 12/581,801

(22) Filed: Oct. 19, 2009

(65) Prior Publication Data

US 2011/0092169 A1 Apr. 21, 2011

(51) Int. Cl.
*H04B 1/40* (2006.01)
*H03H 7/00* (2006.01)
*H01P 3/08* (2006.01)

(52) U.S. Cl. ........ 455/307; 455/323; 455/318; 333/172; 333/204

(58) Field of Classification Search ............... 455/302, 455/303, 304, 305, 306, 307, 318, 323, 326, 455/327, 328; 333/25, 26, 117, 118, 125, 333/128, 136, 138, 164, 172, 204
See application file for complete search history.

(56) References Cited

U.S. PATENT DOCUMENTS

| | | | |
|---|---|---|---|
| 4,914,408 A | | 4/1990 | Voorman |
| 5,084,686 A | * | 1/1992 | Chun ............................ 333/138 |
| 5,715,529 A | | 2/1998 | Kianush et al. |
| 6,134,268 A | | 10/2000 | McCoy |
| 6,148,181 A | * | 11/2000 | Otaka ............................ 455/86 |
| 6,181,181 B1 | * | 1/2001 | Tsukahara et al. ............ 327/233 |
| 6,211,708 B1 | * | 4/2001 | Klemmer ...................... 327/122 |
| 6,346,850 B2 | | 2/2002 | Essink |
| 6,388,543 B1 | | 5/2002 | Molnar et al. |
| 6,441,682 B1 | | 8/2002 | Vinn et al. |
| 6,480,535 B1 | | 11/2002 | Witmayer |
| 6,529,100 B1 | | 3/2003 | Okanobu |
| 6,600,495 B1 | | 7/2003 | Boland et al. |
| 6,621,370 B1 | * | 9/2003 | Dao ................................ 333/25 |
| 6,636,085 B2 | | 10/2003 | Okazaki et al. |
| 6,696,885 B2 | | 2/2004 | Christensen |
| 6,822,496 B2 | * | 11/2004 | Fukuda ......................... 327/238 |
| 6,831,497 B2 | | 12/2004 | Koh et al. |

(Continued)

FOREIGN PATENT DOCUMENTS

GB 2240890 8/1991

OTHER PUBLICATIONS

Behbahani et al, "CMOS Mixers and Polyphase Filters for Large Image Rejection", IEEE Journal of Solid-State Circuits, vol. 36, No. 6, Jun. 2001, pp. 873-887, University of California, Los Angeles, USA.

(Continued)

*Primary Examiner* — Blane J Jackson
(74) *Attorney, Agent, or Firm* — Kevin T. Cheatham

(57) ABSTRACT

An LR polyphase filter implemented with inductors and resistors and capable of operating at high frequencies is described. In one design, the LR polyphase filter includes first and second paths, with each path including an inductor coupled to a resistor. The first and second paths receive a first input signal and provide first and second output signals, respectively, which may be in quadrature. For a differential design, the polyphase filter further includes third and fourth paths, which receive a second input signal and provide third and fourth output signals, respectively. The four output signals may be 90° out of phase. The first and second input signals are for a differential input signal. The first and third output signals are for a first differential output signal, and the second and fourth output signals are for a second differential output signal. Each inductor may be implemented with a transmission line.

33 Claims, 10 Drawing Sheets

U.S. PATENT DOCUMENTS

| | | |
|---|---|---|
| 7,031,690 B2 | 4/2006 | Prodanov et al. |
| 7,095,781 B1 | 8/2006 | Hsu et al. |
| 7,098,731 B1 | 8/2006 | Wyszynski |
| 7,149,498 B2 | 12/2006 | Puma |
| 7,190,942 B1 | 3/2007 | Nise |
| 7,271,647 B2 | 9/2007 | Cao et al. |
| 7,375,582 B2 | 5/2008 | Stikvoort |
| 7,405,363 B2 | 7/2008 | Inoue |
| 7,405,636 B2 | 7/2008 | Ozasa et al. |
| 7,409,417 B2 | 8/2008 | Lou |
| 7,792,215 B2 * | 9/2010 | Choi et al. .............. 375/316 |
| 2002/0008983 A1 | 1/2002 | Souto-Diez et al. |
| 2002/0063606 A1 | 5/2002 | Maria van Zeijl |
| 2005/0260966 A1 | 11/2005 | Wang |
| 2007/0063606 A1 * | 3/2007 | Yun ............................ 310/112 |
| 2007/0242779 A1 * | 10/2007 | Choi et al. ................. 375/332 |
| 2008/0100387 A1 | 5/2008 | Chen et al. |
| 2008/0100398 A1 * | 5/2008 | Afsahi et al. .............. 333/138 |
| 2009/0279642 A1 * | 11/2009 | Zarei .......................... 375/327 |

OTHER PUBLICATIONS

International Search Report and Written Opinion—PCT/US2010/053254, International Search Authority—European Patent Office—Mar. 14, 2011.

* cited by examiner

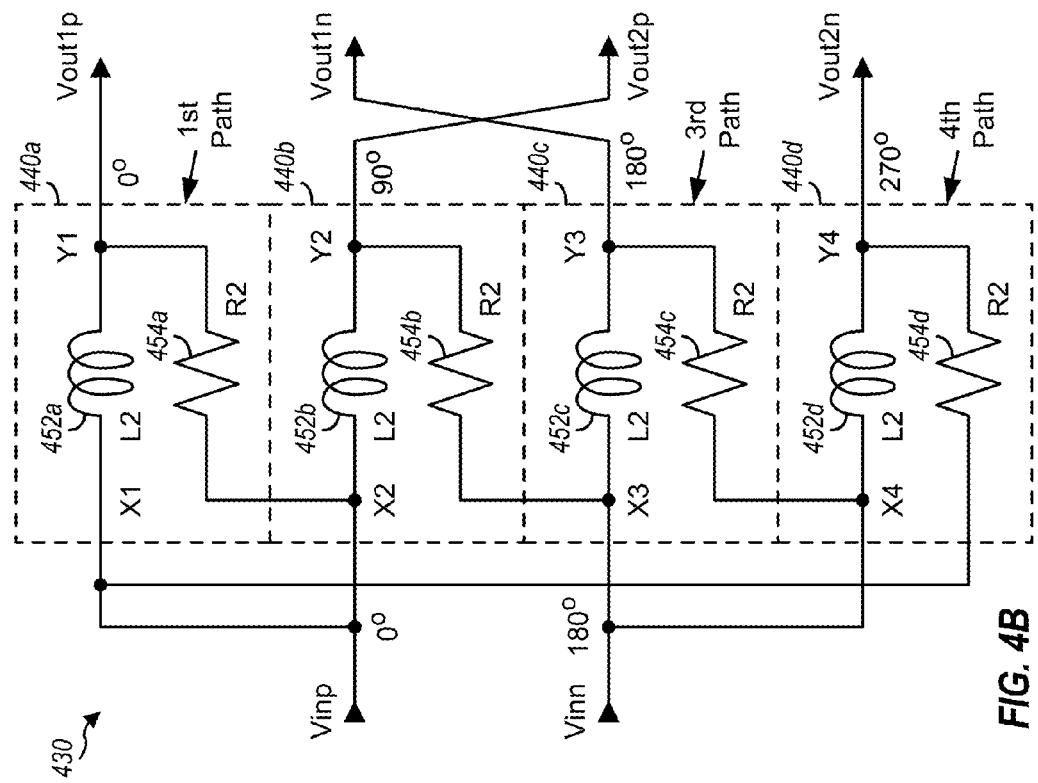
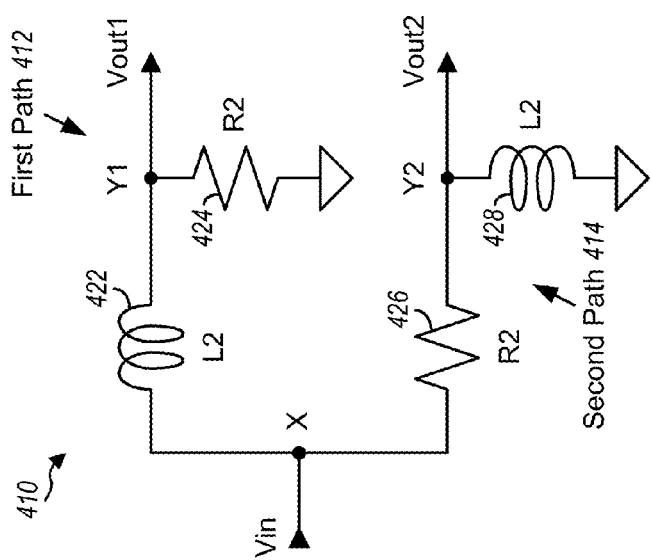
FIG. 4B
FIG. 4A

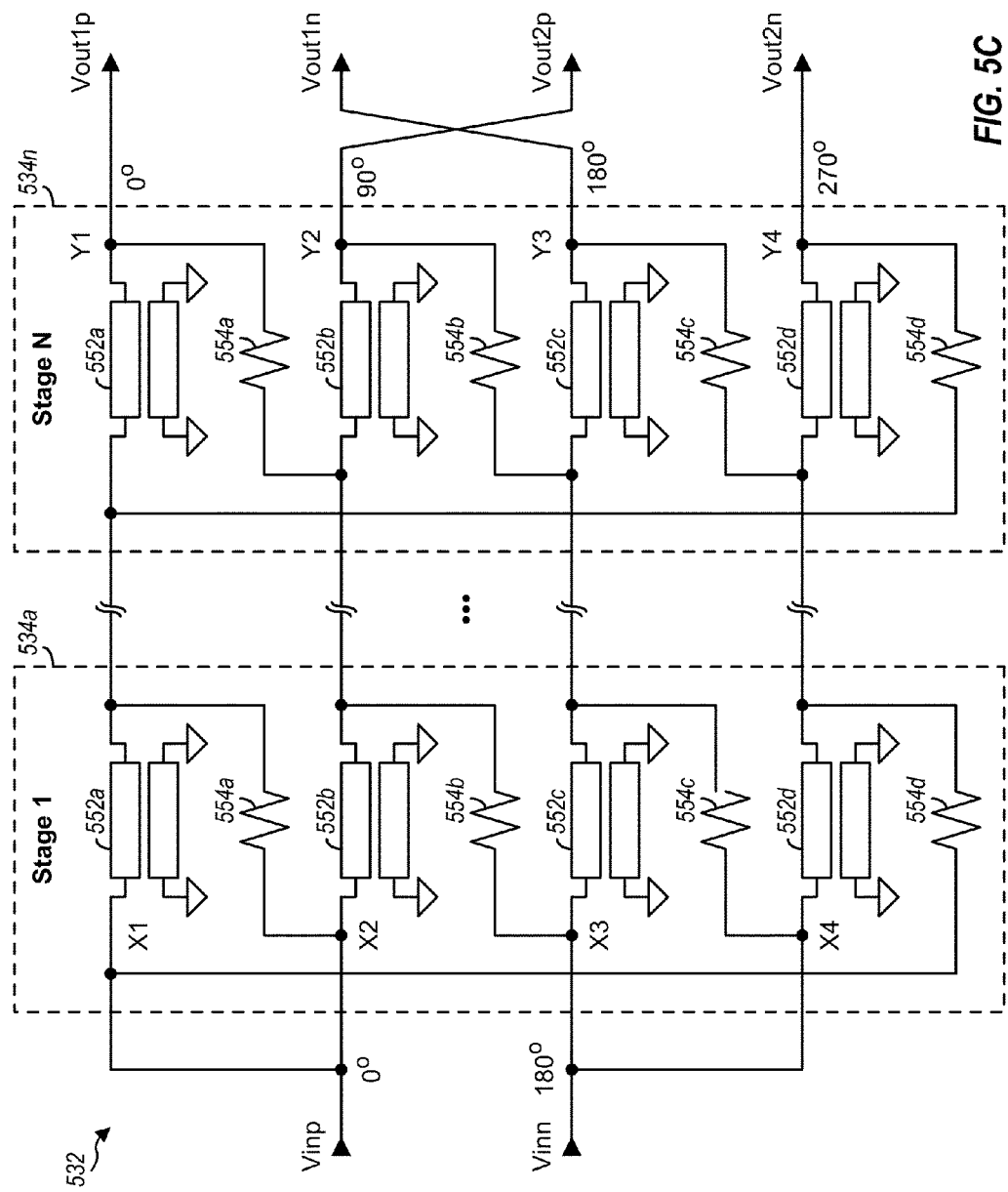

LR POLYPHASE FILTER

BACKGROUND

I. Field

The present disclosure relates generally to electronics, and more specifically to a polyphase filter.

II. Background

A polyphase filter is a circuit that receives one or more input signals having different phases and provides an equal or higher number of output signals having different phases. Polyphase filters may be used for various applications such as quadrature signal generation, image rejection, etc. For quadrature signal generation, a polyphase filter may generate output signals that are in quadrature (or 90° out of phase) of each other.

A polyphase filter may be implemented with capacitors and resistors and may be referred to as an RC polyphase filter. The RC polyphase filter may be implemented on an integrated circuit (IC). The capacitors and resistors may then be fabricated on chip and may benefit from high density, good matching, and high yield. At frequencies of a few gigahertz (GHz) or lower, the capacitors and resistors may have capacitive and resistive behavior, and the RC polyphase filter may provide the desired performance. However, at high frequencies (e.g., tens of GHz), the integrated capacitors may demonstrate inductive behavior, which may result in an ineffective RC polyphase filter.

SUMMARY

An LR polyphase filter that may be implemented with inductors and resistors and capable of operating at high frequencies is described herein. In one design, the LR polyphase filter may include first and second paths. The first path may include a first inductor coupled to a first resistor and may receive a first input signal and provide a first output signal. The second path may include a second inductor coupled to a second resistor and may receive the first input signal and provide a second output signal. The second output signal may have a target phase offset (e.g., 90° offset) from the first output signal at a selected frequency (e.g., 60 GHz).

For a differential design, the polyphase filter may further include third and fourth paths. The third path may include a third inductor coupled to a third resistor and may receive a second input signal and provide a third output signal. The fourth path may include a fourth inductor coupled to a fourth resistor and may receive the second input signal and provide a fourth output signal. The inductors and resistors in the four paths may be coupled as described below. The first and second input signals may be for a differential input signal. The first and third output signals may be for a first differential output signal, and the second and fourth output signals may be for a second differential output signal. The first, second, third and fourth output signals may be 90° out of phase. In one design, each inductor may be implemented with a transmission line. The transmission lines for all inductors may be formed with routing traces from an oscillator to mixers.

Various aspects and features of the disclosure are described in further detail below.

BRIEF DESCRIPTION OF THE DRAWINGS

FIG. 4A shows a schematic diagram of a single-ended LR polyphase filter.

FIG. 4B shows a schematic diagram of a differential LR polyphase filter.

FIGS. 5A, 5B and 5C show schematic diagrams of single-ended, differential and N-stage LR polyphase filters, respectively, implemented with transmission lines.

DETAILED DESCRIPTION

The word "exemplary" is used herein to mean "serving as an example, instance, or illustration." Any design described herein as "exemplary" is not necessarily to be construed as preferred or advantageous over other designs.

The LR polyphase filter described herein may be used for various applications such as wireless communication, computing, networking, consumer electronics, etc. The LR polyphase filter may also be used for various electronics devices such as wireless communication devices, broadcast receivers, personal digital assistants (PDAs), handheld devices, wireless modems, laptop computers, cordless phones, wireless local loop (WLL) stations, Bluetooth devices, consumer electronics devices, etc. For clarity, the use of the LR polyphase filter in a wireless communication device is described below.

Figure 1:
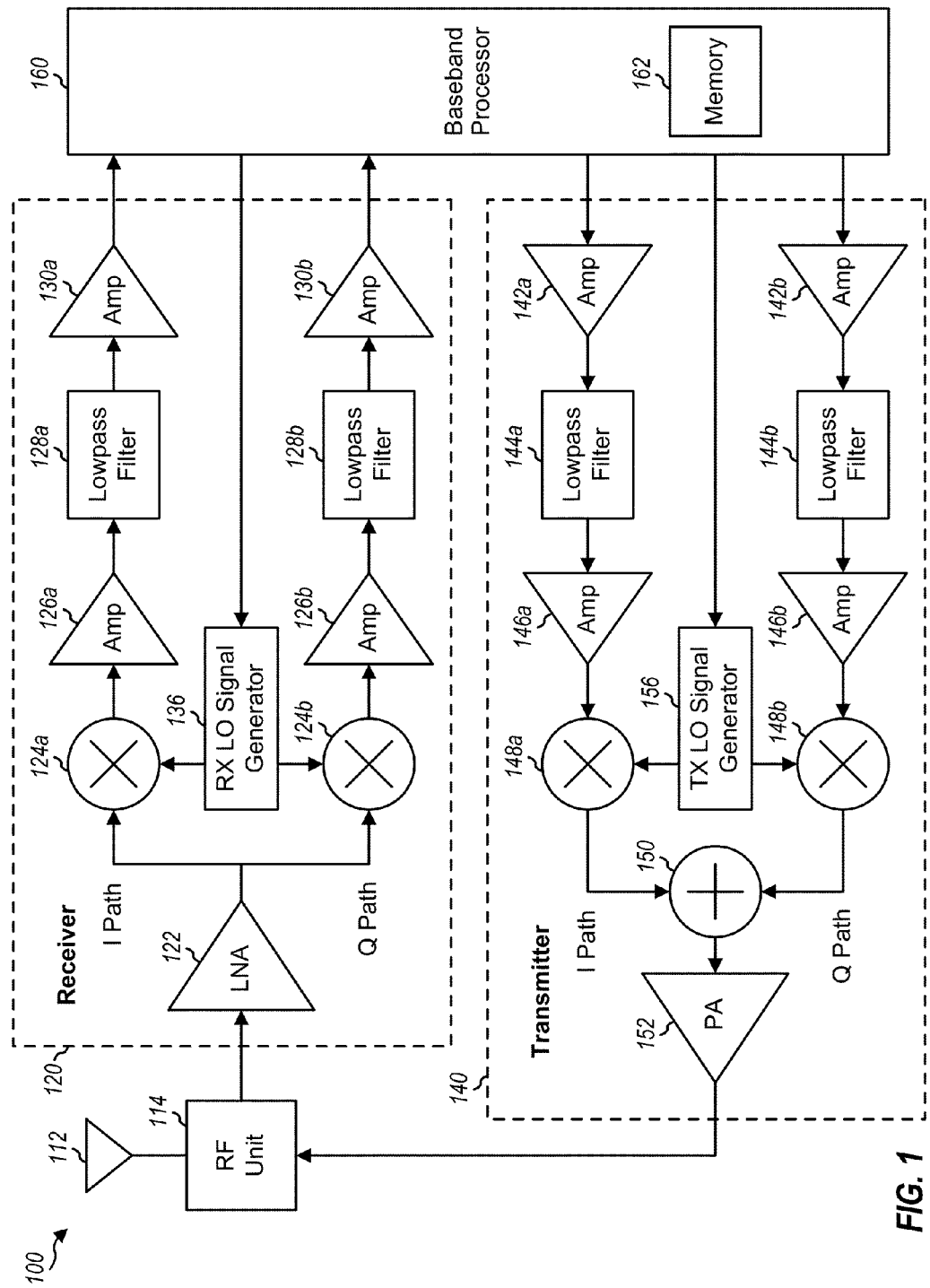
FIG. 1 shows a block diagram of a wireless communication device.

FIG. 1 shows a block diagram of an exemplary design of a wireless communication device 100, which may be a cellular phone, a wireless local area network (WLAN) station, or some other device. In the exemplary design shown in FIG. 1, wireless device 100 includes a receiver 120 and a transmitter 140 that support bi-directional communication. In general, wireless device 100 may include any number of receivers and any number of transmitters for any number of communication systems, any number of radio technologies, and any number of frequency bands.

In the receive path, an antenna 112 receives radio frequency (RF) modulated signals transmitted by base stations and/or other transmitter stations and provides a received RF signal, which is routed through an RF unit 114 and provided to receiver 120. RF unit 114 may include an RF switch and/or a duplexer to multiplex RF signals for transmitter 140 and receiver 120. RF unit 114 may also include RF filters and/or other circuits. Within receiver 120, a low noise amplifier (LNA) 122 amplifies the received RF signal and provides an amplified RF signal. Mixers 124a and 124b downconvert the amplified RF signal from RF to baseband and provide inphase (I) and quadrature (Q) downconverted signals, respectively. An LO signal generator 136 generates I and Q LO signals used for frequency downconversion and provides the I and Q LO signals to mixers 124a and 124b, respectively. The I and Q downconverted signals from mixers 124a and 124b are amplified by amplifiers (Amp) 126a and 126b, filtered by lowpass filters 128a and 128b, and further amplified by amplifiers 130a and 130b to obtain I and Q baseband input signals, which are provided to a baseband processor 160. The I and Q baseband input signals may be digitized and processed (e.g., demodulated and decoded) by baseband processor 160 to recover transmitted data.

In the transmit path, baseband processor 160 processes data to be transmitted and provides I and Q baseband output signals to transmitter 140. Within transmitter 140, the I and Q baseband output signals are amplified by amplifiers 142a and 142b, filtered by lowpass filters 144a and 144b, and further amplified by amplifiers 146a and 146b to obtain I and Q input signals. The I and Q input signals are upconverted from baseband to RF by mixers 148a and 148b, summed by a summer 150, and amplified by a power amplifier (PA) 152 to obtain an output RF signal, which is routed through RF unit 114 and transmitted via antenna 112. An LO signal generator 156 generates I and Q LO signals used for frequency upconversion and provides the I and Q LO signals to mixers 148a and 148b, respectively.

FIG. 1 shows exemplary designs of receiver 120 and transmitter 140 with a direct-conversion architecture, which frequency converts a signal between RF and baseband in one stage. Receiver 120 and transmitter 140 may also be implemented with a super-heterodyne architecture that converts a signal between RF and baseband in multiple stages. In general, the conditioning of the signals in a receiver and a transmitter may be performed by one or more stages of amplifier, filter, mixer, etc. The circuit blocks may be arranged differently from the configuration shown in FIG. 1. Furthermore, other circuit blocks not shown in FIG. 1 may also be used to condition the signals in the transmitter and receiver. Some circuit blocks in FIG. 1 may also be omitted. All or a portion of receiver 120 and transmitter 140 may be implemented on one or more analog ICs, RF ICs (RFICs), mixed-signal ICs, etc.

Baseband processor 160 may include various processing units for data transmission and reception as well as other functions. Baseband processor 160 may also generate controls for various circuit blocks in receiver 120 and transmitter 140. A memory 162 may store program codes and data for wireless device 100 and may be internal to baseband processor 160 (as shown in FIG. 1) or external to baseband processor 160. Baseband processor 160 may be implemented on one or more application specific integrated circuits (ASICs) and/or other ICs.

Wireless device 100 may operate at high frequency. For example, wireless device 100 may support IEEE 802.11 for Very High Throughput (VHT) in 60 GHz frequency band, which may cover 57 to 66 GHz. The circuit blocks in receiver 120 and transmitter 140 may be designed to support operation at high frequency.

In an aspect, an LR polyphase filter may be used to generate LO signals used for frequency downconversion and/or upconversion. The LR polyphase filter may receive an input signal from an oscillator and may provide output signals that are in quadrature of one another. The LR polyphase filter may be able to operate at high frequency and may have other desirable characteristics, as described below.

Figure 2:
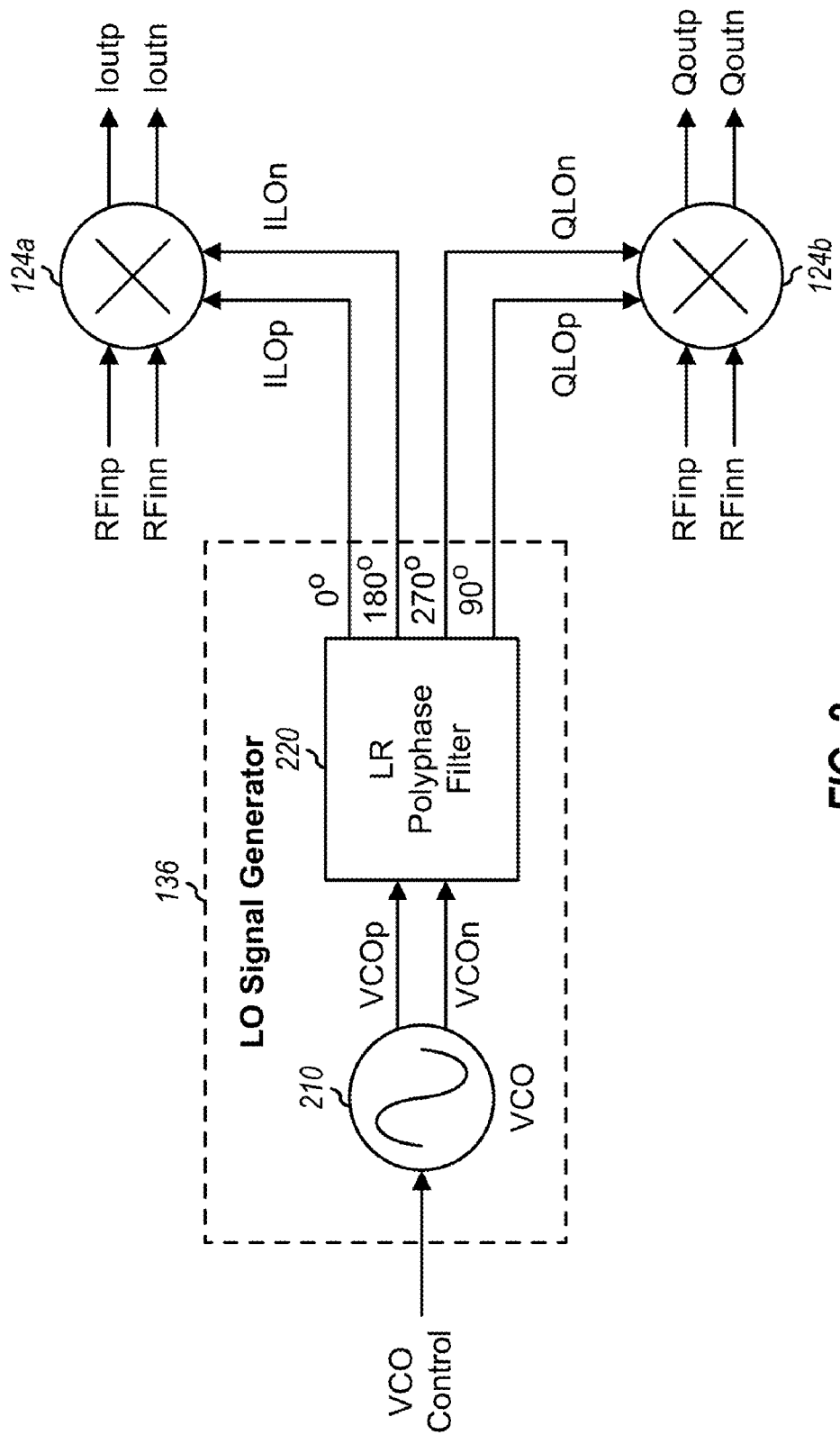
FIG. 2 shows a block diagram of a local oscillator (LO) signal generator.

FIG. 2 shows a block diagram of a design of LO signal generator 136 for receiver 120 in FIG. 1. FIG. 2 shows a differential design in which each circuit receives one or more differential input signals and provides one or more differential output signals. Each differential signal comprises a non-inverting signal (denoted by postfix "p") and an inverting signal (denoted by postfix "n"). In general, a circuit (e.g., a mixer) may receive single-ended or different inputs and may provide single-ended or different outputs.

Within LO signal generator 136, a voltage controlled oscillator (VCO) 210 receives a VCO control and provides a differential VCO signal comprising VCOp and VCOn signals. VCO 210 may operate at high frequency, e.g., near 60 GHz for IEEE 802.11 VHT or some other frequency. An LR polyphase filter 220 receives the differential VCO signal and provides (i) a differential I LO signal comprising ILOp and ILOn signals and (ii) a differential Q LO signal comprising QLOp and QLOn signals. The QLOp signal is 90° out of phase with respect to the ILOp signal. Mixer 124a downconverts a differential input RF signal comprising RFinp and RFinn signals with the differential I LO signal and provides a differential I downconverted signal comprising Ioutp and Ioutn signals. Mixer 124b downconverts the differential input RF signal with the differential Q LO signal and provides a differential Q downconverted signal comprising Qoutp and Qoutn signals.

FIG. 2 shows an exemplary design of LO signal generator 136, which may also be implemented in other manners. For example, VCO 210 may be replaced with a current controlled oscillator (ICO), a digitally controlled oscillator (DCO), etc. LO signal generator 156 for transmitter 140 may be implemented in similar manner as LO signal generator 136 for receiver 120. For a frequency division duplexed (FDD) system, different frequency channels are used for the downlink and uplink. In this case, wireless device 100 may transmit and receive simultaneously, and separate LO signal generators 136 and 156 may be used to concurrently generate LO signals for receiver 120 and transmitter 140. For a time division duplexed (TDD) system, the same frequency channel is used for both the downlink and uplink, which may be allocated different time intervals. In this case, wireless device 100 may either transmit or receive at any given moment, and a single LO signal generator 136 or 156 can generate LO signals for both receiver 120 and transmitter 140.

Figure 3B:
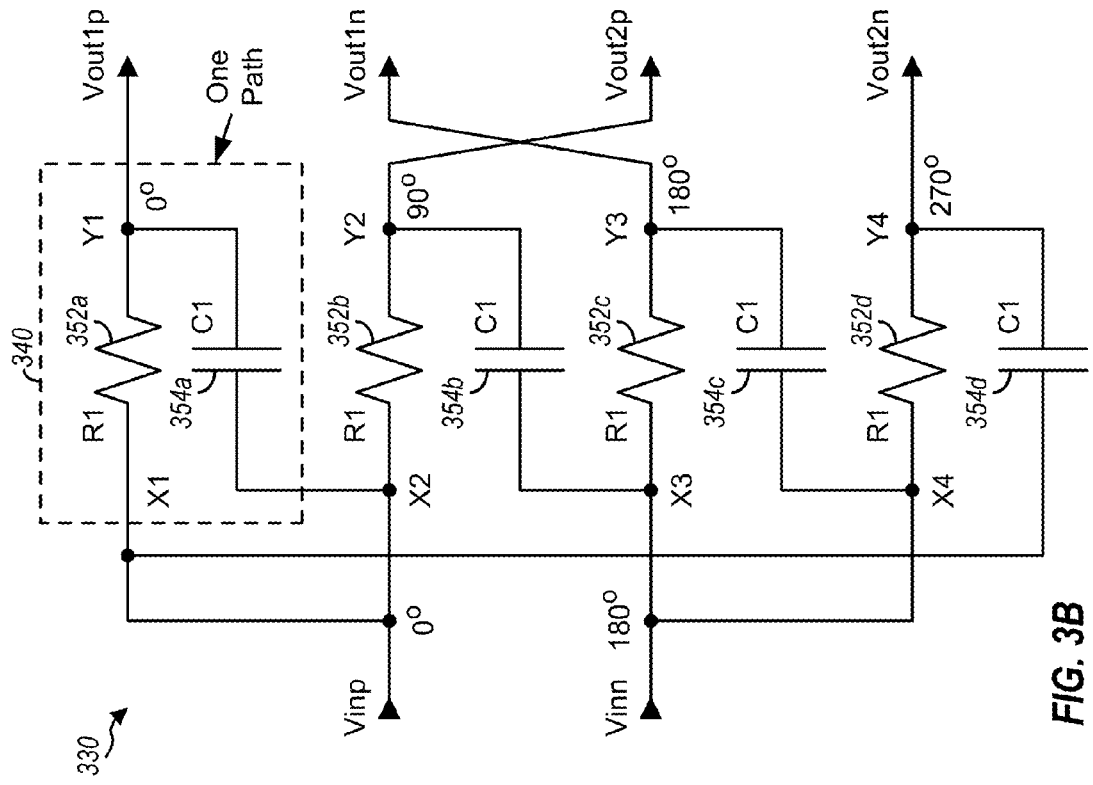
FIG. 3B shows a schematic diagram of a differential RC polyphase filter.
Figure 3A:
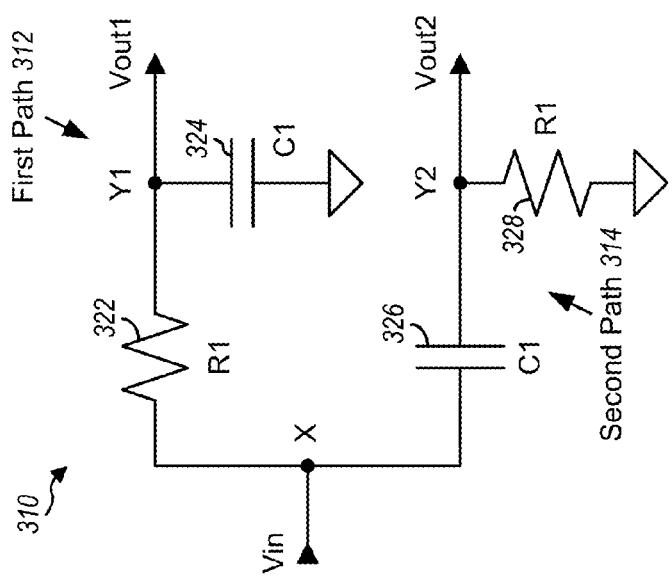
FIG. 3A shows a schematic diagram of a single-ended RC polyphase filter.

FIG. 3A shows a schematic diagram of a single-ended RC polyphase filter 310. Polyphase filter 310 receives a single-ended input signal, Vin, and provides two single-ended output signals, Vout1 and Vout2, which are 90° out of phase. Polyphase filter 310 includes two paths 312 and 314 for the two output signals. In the first path 312, a resistor 322 is coupled between input node X and output node Y1, and a capacitor 324 is coupled between output node Y1 and circuit ground. In the second path 314, a capacitor 326 is coupled between input node X and output node Y2, and a resistor 328 is coupled between output node Y2 and circuit ground. The Vin signal is applied to input node X, and the Vout1 and Vout2 signals are provided by output nodes Y1 and Y2, respectively.

Resistors 322 and 328 each has a resistance of R1, and capacitors 324 and 326 each has a capacitance of C1. Resistor 322 and capacitor 324 in the first path 312 form a single-pole lowpass filter that provides 45° phase lag at the 3 dB bandwidth, which is determined by the values of R1 and C1. Capacitor 326 and resistor 328 in the second path form a single-pole highpass filter that provides 45° phase lead at the 3 dB bandwidth, which is also determined by the values of R1 and C1. R1 and C1 may be selected to provide 90° phase difference between the Vout1 and Vout2 signals at the desired frequency.

FIG. 3B shows a schematic diagram of a differential RC polyphase filter 330. Polyphase filter 330 receives a differential input signal comprising Vinp and Vinn signals and provides (i) a first differential output signal comprising Vout1p and Vout1n signals and (ii) a second differential output signal comprising Vout2p and Vout2n signals. Polyphase filter 330 includes four paths for the four Vout signals. Only one path 340 is labeled in FIG. 3B. The first path includes a resistor 352a coupled between input node X1 and output node Y1 and a capacitor 354a coupled between output node Y1 and input node X2. The second path includes a resistor 352b coupled between input node X2 and output node Y2 and a capacitor 354b coupled between output node Y2 and input node X3. The third path includes a resistor 352c coupled between input node X3 and output node Y3 and a capacitor 354c coupled between output node Y3 and input node X4. The fourth path includes a resistor 352d coupled between input node X4 and output node Y4 and a capacitor 354d coupled between output node Y4 and input node X1. Each resistor 352 has a resistance of R1, and each capacitor 354 has a capacitance of C1. The Vinp signal is provided to input nodes X1 and X2, and the Vinn signal is provided to input nodes X3 and X4. The Vout1p, Vout2p, Vout1n and Vout2n signals are provided by output nodes Y1, Y2, Y3 and Y4, respectively.

The Vout signal at each output node is obtained by superposition of the Vin signals at two input nodes. For example, the Vout1p signal is obtained by superposition of (i) the Vinp signal applied at input node X1, which observes a lowpass path to node Y1, and (ii) the Vinp signal applied at input node X2, which observes a highpass path to node Y1. The Vout1p signal at node Y1 has a phase that is the average of the phases of the Vin signals applied at nodes X1 and X2. Similarly, the phase of the Vout2p signal at node Y2 is the average of the phase of the Vinp signal applied at node X2 and the phase of the Vinn signal applied at node X3. The phase of the Vout1n signal at node Y3 is the average of the phase of the Vinn signal applied at nodes X3 and X4. The phase of the Vout2n signal at node Y4 is the average of the phase of the Vinp signal applied at node X1 and the phase of the Vinn signal applied at node X4.

RC polyphase filter 330 may be used to generate quadrature LO signals from a differential source. RC polyphase filter 330 may be implemented with a combination of resistors 352 and capacitors 354 that may be well matched to obtain the desired phase shift and the best possible amplitude. To obtain the desired performance for RC polyphase filter 330, resistors 352 and capacitors 354 should exhibit pure resistive and capacitive behavior. RC polyphase filter 330 may be implemented on an IC, and resistors 352 and capacitors 354 may be fabricated on chip. However, at millimeter (mm)-wave frequencies (e.g., 60 GHz), the integrated capacitors may be associated with parasitic that may completely deviate their characteristic from the desired behavior. At such high frequencies, the integrated capacitors may demonstrate inductive behavior, which may then result in an ineffective RC polyphase filter 330.

Based on RLC circuit theory, RC circuits and LR circuits are dual of each other. This means that an RC circuit may be transformed to an LR circuit by (i) replacing each resistor in the RC circuit with an inductor in the LR circuit and (ii) replacing each capacitor in the RC circuit with a resistor in the LR circuit. The RC circuit and the LR circuit would then exhibit similar characteristic.

FIG. 4A shows a schematic diagram of a design of a single-ended LR polyphase filter 410. Polyphase filter 410 receives a single-ended input signal, Vin, and provides two single-ended output signals, Vout1 and Vout2, which are 90° out of phase. Polyphase filter 410 includes two paths 412 and 414 for the two output signals. In the first path 412, an inductor 422 is coupled between input node X and output node Y1, and a resistor 424 is coupled between output node Y1 and circuit ground. In the second path 414, a resistor 426 is coupled between input node X and output node Y2, and an inductor 428 is coupled between output node Y2 and circuit ground.

The Vin signal is applied to input node X, and the Vout1 and Vout2 signals are provided by output nodes Y1 and Y2, respectively.

Inductors 422 and 428 each has an inductance of L2, and resistors 424 and 426 each has a resistance of R2. Inductor 422 and resistor 424 in the first path 412 form a single-pole lowpass filter that provides 45° phase lag at the 3 dB bandwidth, which is determined by the values of L2 and R2. Resistor 426 and inductor 428 in the second path 414 form a single-pole highpass filter that provides 45° phase lead at the 3 dB bandwidth, which is also determined by the values of L2 and R2. L2 and R2 may be selected to provide 90° phase difference between the Vout1 and Vout2 signals at the desired frequency. LR polyphase filter 410 has similar performance as RC polyphase filter 310 in FIG. 3A if $R1C1=L2/R2$.

FIG. 4B shows a schematic diagram of a design of a differential LR polyphase filter 430. Polyphase filter 430 receives a differential input signal comprising Vinp and Vinn signals and provides (i) a first differential output signal comprising Vout1p and Vout1n signals and (ii) a second differential output signal comprising Vout2p and Vout2n signals. Polyphase filter 430 includes four paths 440 for the four Vout signals. The first path 440a includes an inductor 452a coupled between input node X1 and output node Y1 and a resistor 454a coupled between output node Y1 and input node X2. The second path 440b includes an inductor 452b coupled between input node X2 and output node Y2 and a resistor 454b coupled between output node Y2 and input node X3. The third path 440c includes an inductor 452c coupled between input node X3 and output node Y3 and a resistor 454c coupled between output node Y3 and input node X4. The fourth path 440d includes an inductor 452d coupled between input node X4 and output node Y4 and a resistor 454d coupled between output node Y4 and input node X1. Each inductor 452 has an inductance of L2, and each resistor 454 has a resistance of R2. The Vinp signal is provided to input nodes X1 and X2, and the Vinn signal is provided to input nodes X3 and X4. The Vout1p, Vout2p, Vout1n and Vout2n signals are provided by output nodes Y1, Y2, Y3 and Y4, respectively. The phases of the Vinp and Vinn signals and the phases of the Vout1p, Vout1n, Vout2p and Vout2n signals are shown in FIG. 4B.

Figure 4C:
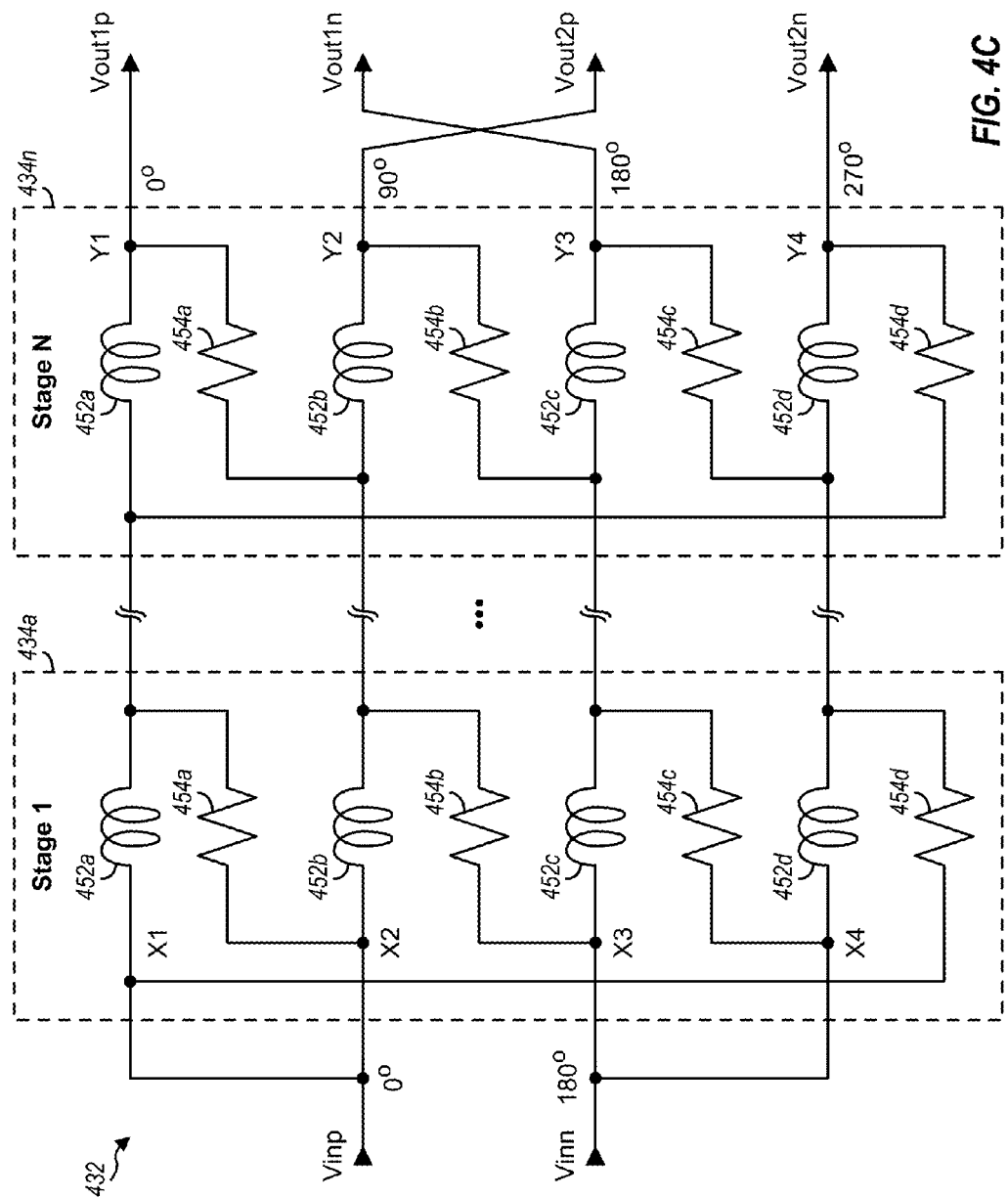
FIG. 4C shows a schematic diagram of an N-stage LR polyphase filter.

FIG. 4C shows a schematic diagram of a design of an N-stage differential LR polyphase filter 432, where in general $N \geq 1$. Polyphase filter 432 includes N stages 434a through 434n that are coupled in series. Each stage 434 includes four paths, and each path includes an inductor 452 and a capacitor 454 that are coupled as described in FIG. 4B. The four output nodes of each stage is coupled to the four input nodes of a subsequent stage. The first stage 434a receives a differential input signal comprising Vinp and Vinn signals, with the Vinp signal being provided to input nodes X1 and X2, and the Vinn signal being provided to input nodes X3 and X4. The last stage 434n provides the Vout1p, Vout2p, Vout1n and Vout2n signals, which are 90° out of phase, via output nodes Y1, Y2, Y3 and Y4, respectively.

In general, an LR polyphase filter may include any number of stages. More stages can further correct for any phase mismatch in the previous stages or the Vin signals but may also have more insertion loss. The number of stages may be selected based on requirements of the LR polyphase filter.

LR polyphase filter 410, 430 or 432 may be implemented on an IC, and the inductors and resistors may be fabricated on chip. At mm-wave frequencies, the integrated inductors still maintain their inductive characteristic. Furthermore, the inductors may have relatively small inductance values at mm-wave frequencies and may occupy a small area. The smaller inductor size may allow for efficient implementation of the LR polyphase filter on chip.

In an exemplary design, the inductors in an LR polyphase filter may be implemented with transmission lines of suitable length. In particular, a transmission line of a quarter wavelength (or λ/4) in length may be used to implement an inductor at high frequency. It may be practical to implement the transmission lines on chip, e.g., since quarter wavelength at 60 GHz is approximately 1.25 mm.

Figure 5B:
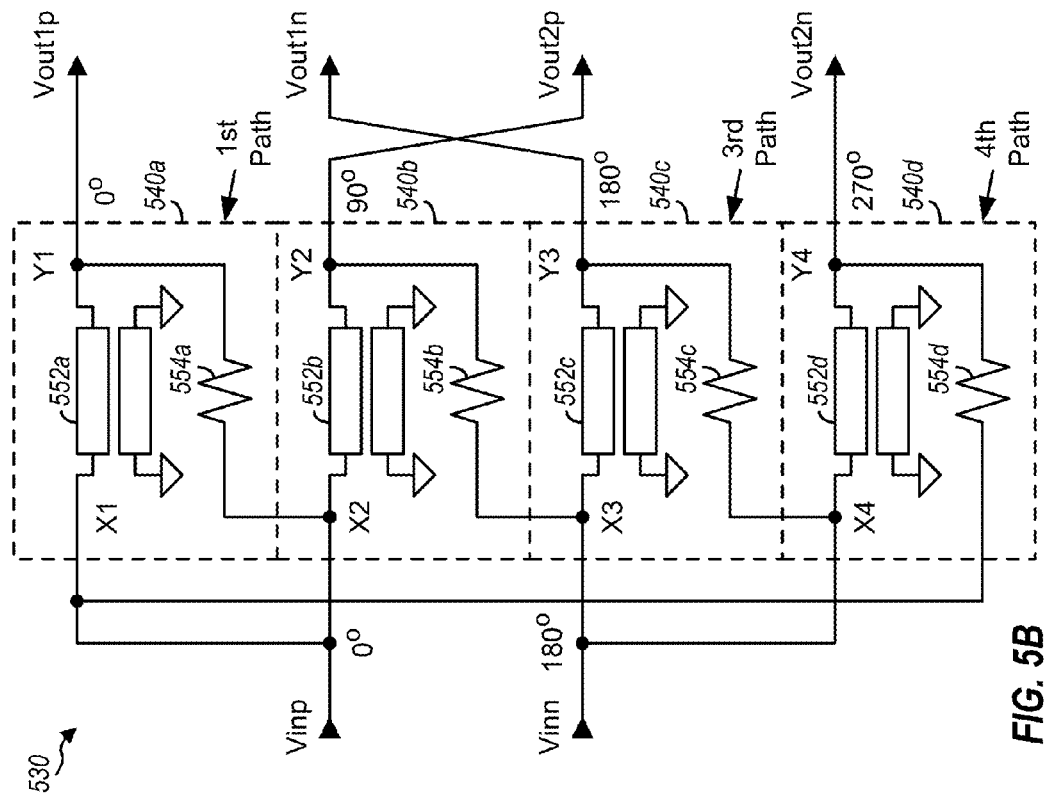
Figure 5A:
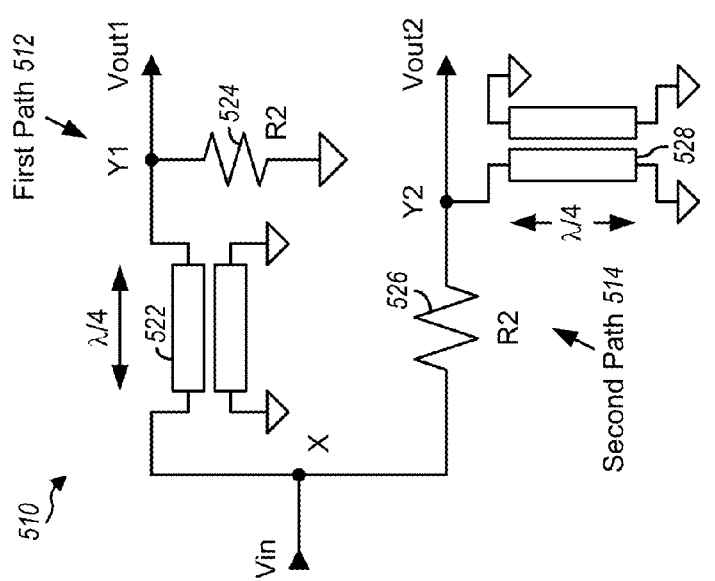

FIG. 5A shows a schematic diagram of a design of a single-ended LR polyphase filter 510 implemented with transmission lines. Polyphase filter 510 includes two paths 512 and 514. In the first path 512, a transmission line 522 runs between input node X and output node Y1, and a resistor 524 is coupled between output node Y1 and circuit ground. In the second path 514, a resistor 526 is coupled between input node X and output node Y2, and a transmission line 528 runs between output node Y2 and circuit ground. The Vin signal is applied to input node X, and the Vout1 and Vout2 signals are provided by output nodes Y1 and Y2, respectively. Resistors 524 and 526 each has a resistance of R2.

Transmission lines 522 and 528 may be designed to have the desired characteristic impedance and delay. The impedance of each transmission line may be dependent on various factors, as described below. The impedance of each transmission line may be matched to R2 to reduce reflection or may not be matched to R2 due to other considerations. Each transmission line may have a length of approximately λ/4 to obtain the desired delay.

FIG. 5B shows a schematic diagram of a design of a differential LR polyphase filter 530 implemented with transmission lines. Polyphase filter 530 includes four paths 540a, 540b, 540c and 540d. Each path 540 includes (i) a transmission line 552 running between an input node and an output node for that path and (ii) a resistor 554 coupled between the output node for that path and an input node for the next path. Each transmission line 552 has a length of approximately λ/4 and a suitable impedance. Each resistor 554 has a resistance of R2. The Vinp signal is provided to input nodes X1 and X2, and the Vinn signal is provided to input nodes X3 and X4. The Vout1p, Vout2p, Vout1n and Vout2n signals are provided by output nodes Y1, Y2, Y3 and Y4, respectively.

FIG. 5C shows a schematic diagram of a design of an N-stage differential LR polyphase filter 532 implemented with transmission lines. Polyphase filter 532 includes N stages 534a through 534n that are coupled in series. Each stage 534 includes four paths, and each path includes a transmission line 552 and a resistor 554 that are coupled as described in FIG. 5B. The Vinp signal is provided to input nodes X1 and X2 in the first stage 534a, and the Vinn signal is provided to input nodes X3 and X4 in the first stage 534a. The Vout1p, Vout2p, Vout1n and Vout2n signals are provided by output nodes Y1, Y2, Y3 and Y4, respectively, in the last stage 534n.

The transmission lines for the inductors in an LR polyphase filter may be implemented with various layouts and structures. Some exemplary transmission line layouts and structures are described below.

Figure 6A:
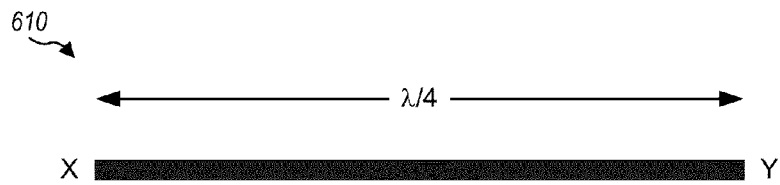
FIGS. 6A, 6B and 6C show top views of three transmission line layouts.

FIG. 6A shows a top view of a design of a transmission line 610. In this design, transmission line 610 is implemented with a conductor formed in a straight line between input node X and output node Y. The conductor may have a length of approximately λ/4 and a suitable width to obtain the desired impedance.

Figure 6B:
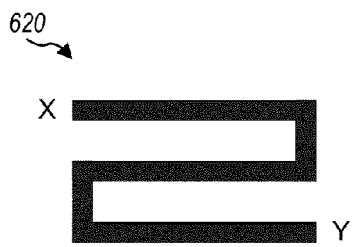

FIG. 6B shows a top view of a design of a transmission line 620 with a zigzag pattern. In this design, transmission line 620 is implemented with a conductor that zigzags back and forth between input node X and output node Y in three sections. The conductor may have a total length of approximately λ/4 and a suitable width to obtain the desired impedance. The number of turns may be dependent on the desired overall size, and more turns may result in a more compact layout but greater insertion loss.

Figure 6C:

FIG. 6C shows a top view of a design of a transmission line 630 with another zigzag pattern. In this design, transmission line 630 is implemented with a conductor that zigzags side to side between input node X and output node Y. The conductor may have a total length of approximately λ/4 and a suitable width to obtain the desired impedance. A transmission line may also be implemented with other layouts.

Figure 7A:
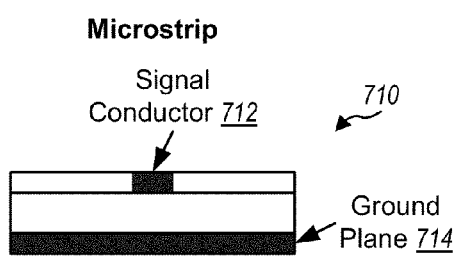
FIGS. 7A, 7B and 7C show cross-sectional views of three transmission line structures.

FIG. 7A shows a cross-sectional view of a design of a transmission line 710 implemented with a microstrip structure. In this design, transmission line 710 is implemented with a signal conductor 712 formed over a ground plane 714. The impedance of transmission line 710 is determined by the width of conductor 712, the distance from conductor 712 to ground plane 714, the dielectric constant of the insulating layer between conductor 712 and ground plane 714, etc. Transmission line 710 may be simple to implement using the microstrip structure.

Figure 7B:
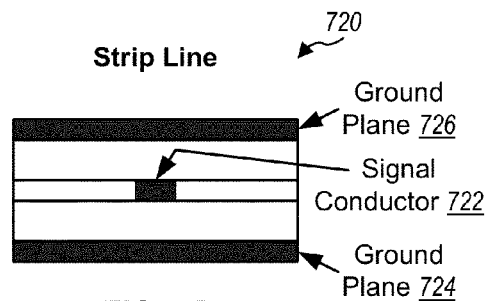

FIG. 7B shows a cross-sectional view of a design of a transmission line 720 implemented with a strip line structure. In this design, transmission line 720 is implemented with a signal conductor 722 formed between two ground planes 724 and 726. The impedance of transmission line 720 is determined by the width of conductor 722, the distance from conductor 722 to ground planes 724 and 726, the dielectric constant of the insulating layers, etc. A smaller width may be used for conductor 722 with the strip line structure.

Figure 7C:
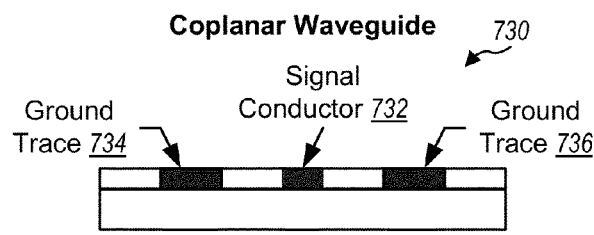

FIG. 7C shows a cross-sectional view of a design of a transmission line 730 implemented with a coplanar waveguide (CPW) structure. In this design, transmission line 730 is implemented with a signal conductor 732 formed between two ground traces 734 and 736 form on the same layer as conductor 732. The impedance of transmission line 720 is determined by the width of conductor 732, the distance from signal conductor 732 to ground traces 734 and 736, etc. The CPW structure can provide good isolation for signal conductor 732 because of the two ground traces 734 and 736 on both sides of conductor 732. A transmission line may also be implemented with other structures.

Figure 8B:
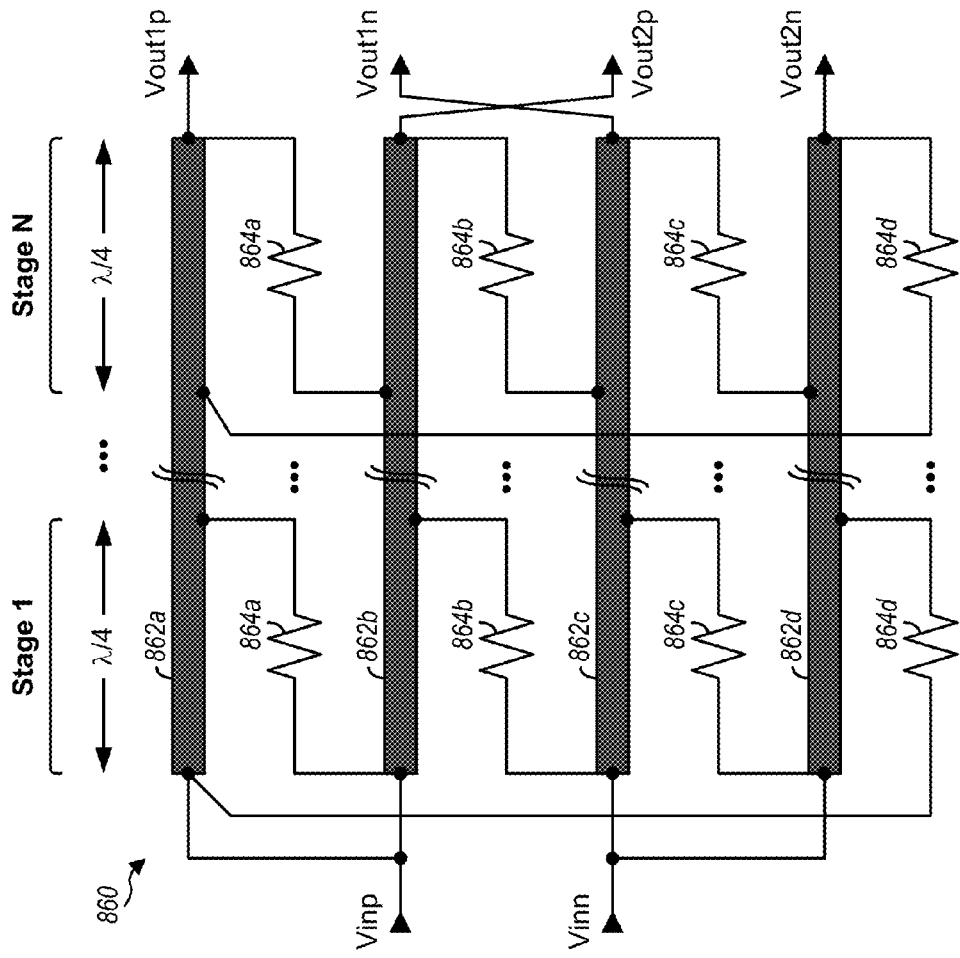
FIGS. 8A and 8B show schematic diagrams of single-stage and N-stage LR polyphase filters, respectively, implemented with transmission lines.
Figure 8A:
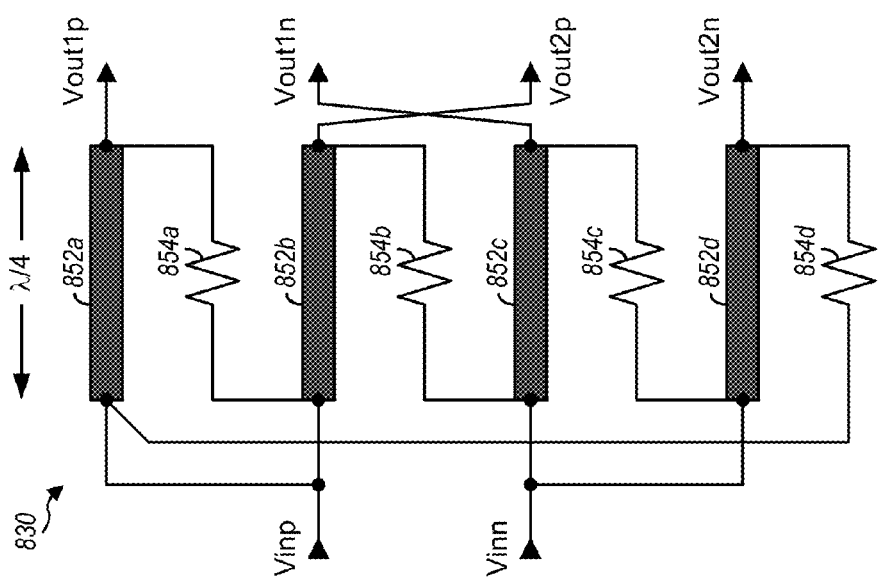

FIG. 8A shows a design of an LR polyphase filter 830 implemented with transmission lines. In this design, four transmission lines 852a, 852b, 852c and 852d of quarter wavelength implement four inductors 452a, 452b, 452c and 452d, respectively, in FIG. 4B. Four resistors 854a, 854b, 854c and 854d correspond to four resistors 454a, 454b, 454c and 454d, respectively, in FIG. 4B. The four transmission lines 852 and the four resistors 854 are coupled between input nodes X1, X2, X3 and X4 and output nodes Y1, Y2, Y3 and Y4 in similar manner as the four inductors 452 and the four resistors 454 in FIG. 4B.

FIG. 8B shows a design of an N-stage LR polyphase filter 860 implemented with transmission lines. In this design, polyphase filter 860 includes N stages. Four transmission lines 862a, 862b, 862c and 862d implement the inductors in all N stages and run between input nodes X1, X2, X3 and X4 and output nodes Y1, Y2, Y3 and Y4, respectively. For the first transmission line 862a, the first quarter wavelength segment implements an inductor for the first stage, the next quarter wavelength segment implements an inductor for the second stage (not shown in FIG. 8B), and so on, and the last quarter wavelength segment implements an inductor for the last stage. Each remaining transmission line 862 similarly implements N inductors in one path for the N stages. Each stage further includes four resistors 864a, 864b, 864c and 864d that are coupled in similar manner as four resistors 854a, 854b, 854c and 854d in FIG. 8A.

As shown in FIG. 8B, a higher order LR polyphase filter may be synthesized by repeating quarter wavelength segments of the transmission lines. Furthermore, routing traces for I and Q LO signals between a VCO and mixers may be used as transmission lines to implement an LR polyphase filter. The LR polyphase filter may thus be efficiently implemented on chip.

The LR polyphase filter described herein may allow for generation of I and Q LO signals at high frequencies, e.g., 60 GHz. The LR polyphase filter may be implemented with inductors or transmission lines, which may be less sensitive to parasitic at high frequencies. Routing traces for the I and Q LO signals may be used for the transmission lines, and the LR polyphase filter may be readily implemented by inserting criss-crossing resistors at every quarter wavelength. The LR polyphase filter may provide the desired performance at high frequencies. In contrast, RC polyphase filters typically do not display the desired performance at high frequencies due to frequency-dependent parasitic of capacitors.

In an exemplary design, an apparatus may comprise a polyphase filter that may include first and second paths. The first path (e.g., path 412 in FIG. 4A or path 440a in FIG. 4B) may include a first inductor coupled to a first resistor and may receive a first input signal and provide a first output signal. The second path (e.g., path 414 in FIG. 4A or path 440b in FIG. 4B) may include a second inductor coupled to a second resistor and may receive the first input signal and provide a second output signal. The second output signal may have a target phase offset (e.g., 90° offset) from the first output signal at a selected frequency (e.g., 60 GHz or some other frequency).

In one design that is shown in FIG. 4A, the first inductor (e.g., inductor 422) may be coupled between an input node X and a first output node Y1, the first resistor (e.g., resistor 424) may be coupled between the first output node and circuit ground, the second resistor (e.g., resistor 426) may be coupled between the input node and a second output node, and the second inductor (e.g., inductor 428) may be coupled between the second output node and circuit ground. The first input signal (e.g., Vin) may be applied to the input node. The first and second output signals (e.g., Vout1 and Vout2) may be provided by the first and second output nodes, respectively.

In another design that is shown in FIG. 4B, the polyphase filter may further include third and fourth paths. The third path (e.g., path 440c) may include a third inductor coupled to a third resistor and may receive a second input signal and provide a third output signal. The fourth path (e.g., path 440d) may include a fourth inductor coupled to a fourth resistor and may receive the second input signal and provide a fourth output signal. In one design, the first, second, third and fourth inductors may be coupled to first, second, third and fourth input nodes, respectively, and may be further coupled to first, second, third and fourth output nodes, respectively. The first, second, third and fourth resistors may be coupled to the first, second, third and fourth output nodes, respectively, and may be further coupled to second, third, fourth and first input nodes, respectively. The first input signal may be applied to the first and second input nodes, and the second input signal may be applied to the third and fourth input nodes. The first, second, third and fourth output signals may be provided by the first, second, third and fourth output nodes, respectively. The first and second input signals may be for a differential input signal. The first and third output signals may be for a first differential output signal, and the second and fourth output signals may be for a second differential output signal. The first, second, third and fourth output signals may be 90° out of phase.

In one design, each inductor may be implemented with a transmission line, e.g., as shown in FIG. 5A or 5B. The transmission lines for all inductors may be implemented with microstrips (e.g., as shown in FIG. 7A), or strip lines (e.g., as shown in FIG. 7B), or coplanar waveguides (e.g., as shown in FIG. 7C), or some other transmission line structure. Each transmission line may have a length of one quarter wavelength at the selected frequency. The transmission lines may be formed by routing traces from an oscillator to one or more mixers.

In one design, the polyphase filter may include multiple stages coupled in series, e.g., as shown in FIG. 4C, 5C or 8B. Each stage may include the first, second, third and fourth paths. The first stage may receive the first and second input signals, and the last stage may provide the first, second, third and fourth output signals. The inductors in the first path in all stages may be implemented with a first transmission line (e.g., transmission line 862a in FIG. 8B). The inductors in each remaining path in all stages may be implemented with a corresponding transmission line. Each inductor may be implemented with a quarter wavelength segment of one transmission line, e.g., as shown in FIG. 8B.

In one design that is shown in FIG. 2, a VCO may generate a differential oscillator signal comprising the first and second input signals. A first mixer may downconvert a differential input RF signal with a differential I LO signal comprising the first and third output signals and may provide a differential I downconverted signal. A second mixer may downconvert the differential input RF signal with a differential Q LO signal comprising the second and fourth output signals and may provide a differential Q downconverted signal. In another design that is shown in FIG. 1, a first mixer may upconvert a differential I baseband signal with a differential I LO signal comprising the first and third output signals. A second mixer may upconvert a differential Q baseband signal with a differential Q LO signal comprising the second and fourth output signals. A summer may sum the outputs of the first and second mixers and may provide a differential upconverted signal.

In an exemplary design, a wireless communication device may comprise a VCO, a polyphase filter, and first and second mixers. The VCO may generate a differential oscillator signal comprising first and second input signals. The polyphase filter may receive the differential oscillator signal and provide (i) a differential I LO signal comprising first and third output signals and (ii) a differential Q LO signal comprising second and fourth output signals. The polyphase filter may include first, second, third and fourth paths, and each path may include an inductor coupled to a resistor, e.g., as shown in FIG. 4B. The first input signal may be applied to the first and second paths, and the second input signal may be applied to the third and fourth paths. The first, second, third and fourth output signals may be provided by the first, second, third and fourth paths, respectively. The polyphase filter may be implemented with transmission lines, as described above. The first mixer may perform frequency conversion between RF and baseband with the differential I LO signal. The second mixer may perform frequency conversion between RF and baseband with the differential Q LO signal.

Figure 9:
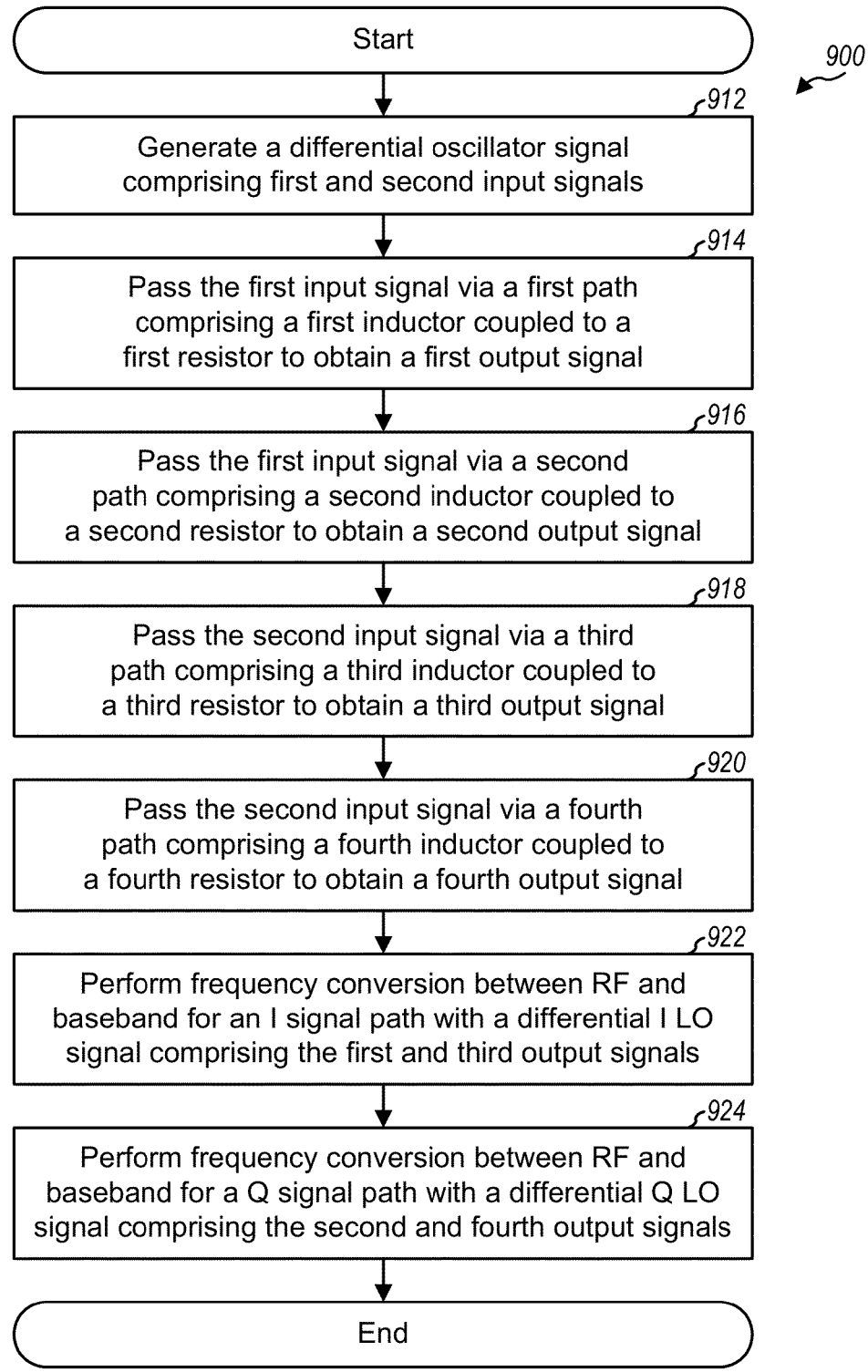
FIG. 9 shows a process for performing polyphase filtering.

FIG. 9 shows a design of a process 900 for performing polyphase filtering. A differential oscillator signal comprising first and second input signals may be generated, e.g., with a VCO (block 912). The first input signal may be passed via a first path comprising a first inductor coupled to a first resistor to obtain a first output signal (block 914). The first input signal may also be passed via a second path comprising a second inductor coupled to a second resistor to obtain a second output signal (block 916). The second input signal may be passed via a third path comprising a third inductor coupled to a third resistor to obtain a third output signal (block 918). The second input signal may also be passed via a fourth path comprising a fourth inductor coupled to a fourth resistor to obtain a fourth output signal (block 920). The four paths may be part of an LR polyphase filter. The first and second input signals may be 180 degrees out of phase. The first, second, third and fourth output signals may be 90° out of phase.

In one design, frequency conversion between RF and baseband for an I signal path may be performed with a differential I LO signal comprising the first and third output signals (block 922). Frequency conversion between RF and baseband for a Q signal path may be performed with a differential Q LO signal comprising the second and fourth output signals (block 924).

The LR polyphase filter described herein may be implemented on an IC, an analog IC, an RFIC, a mixed-signal IC, an ASIC, a printed circuit board (PCB), an electronics device, etc. The LR polyphase filter may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the LR polyphase filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a voltage controlled oscillator (VCO) configured to generate a first input signal; and
   a polyphase filter comprising:
      a first path comprising a first inductor coupled to a first resistor, the first path receiving the first input signal and providing a first output signal,
      a second path comprising a second inductor coupled to a second resistor, the second path receiving the first input signal and providing a second output signal, the second output signal having a target phase offset from the first output signal at a selected frequency,
      a third path comprising a third inductor coupled to a third resistor, the third path receiving a second input signal and providing a third output signal, and
      a fourth path comprising a fourth inductor coupled to a fourth resistor, the fourth path receiving the second input signal and providing a fourth output signal.

2. The apparatus of claim 1, wherein the first inductor is coupled between an input node and a first output node, the first resistor is coupled between the first output node and circuit ground, the second resistor is coupled between the input node and a second output node, and the second inductor is coupled between the second output node and circuit ground, wherein the first input signal is applied to the input node, and wherein the first and second output signals are provided by the first and second output nodes, respectively.

3. The apparatus of claim 1, wherein the first and second input signals are for a differential input signal, the first and third output signals are for a first differential output signal, and the second and fourth output signals are for a second differential output signal, and wherein the first, second, third and fourth output signals are 90 degrees out of phase.

4. The apparatus of claim 1, wherein the first, second, third and fourth inductors are coupled to first, second, third and fourth input nodes, respectively, and are further coupled to first, second, third and fourth output nodes, respectively, wherein the first, second, third and fourth resistors are coupled to the first, second, third and fourth output nodes, respectively, and are further coupled to second, third, fourth and first input nodes, respectively, wherein the first input signal is applied to the first and second input nodes and the second input signal is applied to the third and fourth input nodes, and wherein the first, second, third and fourth output signals are provided by the first, second, third and fourth output nodes, respectively.

5. The apparatus of claim 1, the polyphase filter comprising multiple stages coupled in series, each stage comprising the first, second, third and fourth paths, wherein a first stage receives the first and second input signals and a last stage provides the first, second, third and fourth output signals.

6. The apparatus of claim 5, wherein inductors in the first path in the multiple stages are implemented with a first transmission line, wherein inductors in the second path in the multiple stages are implemented with a second transmission line, wherein inductors in the third path in the multiple stages are implemented with a third transmission line, wherein inductors in the fourth path in the multiple stages are implemented with a fourth transmission line, and wherein each inductor is implemented with a quarter wavelength segment of one transmission line.

7. The apparatus of claim 1, wherein the first inductor is implemented with a first transmission line and the second inductor is implemented with a second transmission line.

8. The apparatus of claim 7, wherein the first and second transmission lines are implemented with microstrips.

9. The apparatus of claim 7, wherein the first and second transmission lines are implemented with strip lines.

10. The apparatus of claim 7, wherein the first and second transmission lines are implemented with coplanar waveguides.

11. The apparatus of claim 7, wherein each transmission line has a length of one quarter wavelength at the selected frequency.

12. The apparatus of claim 1, wherein the first, second, third and fourth inductors are implemented with first, second, third and fourth transmission lines, respectively.

13. The apparatus of claim 12, wherein the first, second, third and fourth transmission lines are formed by routing traces from an oscillator to at least one mixer.

14. The apparatus of claim 1, wherein the VCO is a differential VCO configured to generate a differential oscillator signal comprising the first input signal and the second input signal.

15. The apparatus of claim 1, further comprising:
a first mixer downconverting a differential input radio frequency (RF) signal with a differential inphase (I) local oscillator (LO) signal comprising the first and third output signals and providing a differential I downconverted signal; and
a second mixer downconverting the differential input RF signal with a differential quadrature (Q) LO signal comprising the second and fourth output signals and providing a differential Q downconverted signal.

16. The apparatus of claim 1, further comprising:
a first mixer upconverting a differential inphase (I) baseband signal with a differential I local oscillator (LO) signal comprising the first and third output signals;
a second mixer upconverting a differential quadrature (Q) baseband signal with a differential Q LO signal comprising the second and fourth output signals; and
a summer summing outputs of the first and second mixers and providing a differential upconverted signal.

17. The apparatus of claim 1, wherein the selected frequency is in a 60 gigahertz (GHz) band.

18. An integrated circuit comprising:
a polyphase filter comprising:
a first path comprising a first inductor coupled to a first resistor, the first path receiving a first input signal and providing a first output signal,
a second path comprising a second inductor coupled to a second resistor, the second path receiving the first input signal and providing a second output signal, the second output signal having a target phase offset from the first output signal at a selected frequency,
a third path comprising a third inductor coupled to a third resistor, the third path receiving a second input signal and providing a third output signal, and
a fourth path comprising a fourth inductor coupled to a fourth resistor, the fourth path receiving the second input signal and providing a fourth output signal.

19. The integrated circuit of claim 18, wherein the first inductor is implemented with a first transmission line and the second inductor is implemented with a second transmission line.

20. The integrated circuit of claim 18, wherein the first, second, third and fourth inductors are implemented with first, second, third and fourth transmission lines, respectively.

21. A wireless communication device comprising:
a voltage controlled oscillator (VCO) generating a differential oscillator signal comprising first and second input signals;
a polyphase filter receiving the differential oscillator signal and providing a differential inphase (I) local oscillator (LO) signal comprising first and third output signals and a differential quadrature (Q) LO signal comprising second and fourth output signals, the polyphase filter comprising first, second, third and fourth paths, each path comprising an inductor coupled to a resistor, wherein the first input signal is applied to the first and second paths and the second input signal is applied to the third and fourth paths, and wherein the first, second, third and fourth output signals are provided by the first, second, third and fourth paths, respectively;
a first mixer performing frequency conversion between radio frequency (RF) and baseband with the differential I LO signal; and
a second mixer performing frequency conversion between RF and baseband with the differential Q LO signal.

22. The wireless communication device of claim 21, wherein the first, second, third and fourth inductors are implemented with first, second, third and fourth transmission lines, respectively.

23. The wireless communication device of claim 21, wherein the first and second mixers are for a downconverter in a receiver within the wireless device.

24. The wireless communication device of claim 21, wherein the first and second mixers are for an upconverter in a transmitter within the wireless device.

25. A method of performing polyphase filtering, comprising:
passing a first input signal via a first path comprising a first inductor coupled to a first resistor to obtain a first output signal;
passing the first input signal via a second path comprising a second inductor coupled to a second resistor to obtain a second output signal, the second output signal having a target phase offset from the first output signal at a selected frequency, wherein the selected frequency is in a 60 gigahertz (GHz) band;
passing a second input signal via a third path comprising a third inductor coupled to a third resistor to obtain a third output signal; and
passing the second input signal via a fourth path comprising a fourth inductor coupled to a fourth resistor to obtain a fourth output signal.

26. The method of claim 25, wherein the first and second input signals are 180 degrees out of phase, and wherein the first, second, third and fourth output signals are 90 degrees out of phase.

27. The method of claim 25, further comprising:
generating a differential oscillator signal comprising the first and second input signals.

28. The method of claim 25, further comprising:
performing frequency conversion between radio frequency (RF) and baseband for an inphase (I) signal path with a differential I local oscillator (LO) signal comprising the first and third output signals; and performing frequency conversion between RF and baseband for a quadrature (Q) signal path with a differential Q LO signal comprising the second and fourth output signals.

29. An apparatus comprising:
a polyphase filter comprising:
  a first path comprising a first inductor coupled to a first resistor, the first path coupled to receive a first input signal and further coupled to provide a first output signal;
  a second path comprising a second inductor coupled to a second resistor, the second path coupled to receive the first input signal and further coupled to provide a second output signal, the second output signal having a target phase offset from the first output signal at a selected frequency, wherein the first inductor comprises a first transmission line and the second inductor comprises a second transmission line;
  a third path comprising a third inductor coupled to a third resistor, the third path coupled to receive a second input signal and further coupled to provide a third output signal; and
  a fourth path comprising a fourth inductor coupled to a fourth resistor, the fourth path coupled to receive the second input signal and further coupled to provide a fourth output signal.

30. The apparatus of claim 29, further comprising:
a first mixer coupled to downconvert a differential input radio frequency (RF) signal with a differential inphase local oscillator (LO) signal comprising the first and third output signals and further coupled to provide a differential inphase downconverted signal; and
a second mixer coupled to downconvert the differential input RF signal with a differential quadrature LO signal comprising the second and fourth output signals and further coupled to provide a differential quadrature downconverted signal.

31. The apparatus of claim 29, further comprising:
a first mixer coupled to upconvert a differential inphase baseband signal with a differential inphase local oscillator (LO) signal comprising the first and third output signals;
a second mixer coupled to upconvert a differential quadrature baseband signal with a differential quadrature LO signal comprising the second and fourth output signals; and
a summer coupled to sum outputs of the first and second mixers and further coupled to provide a differential upconverted signal.

32. A wireless communication device comprising:
means for generating a differential oscillator signal comprising first and second input signals;
means for receiving the differential oscillator signal and for providing a differential inphase (I) local oscillator (LO) signal comprising first and third output signals and a differential quadrature (Q) LO signal comprising second and fourth output signals, the means for receiving the differential oscillator signal comprising first, second, third and fourth paths, each path comprising an inductor coupled to a resistor, wherein the first input signal is applied to the first and second paths and the second input signal is applied to the third and fourth paths, and wherein the first, second, third and fourth output signals are provided by the first, second, third and fourth paths, respectively;
means for performing frequency conversion between radio frequency (RF) and baseband with the differential I LO signal; and
means for performing frequency conversion between RF and baseband with the differential Q LO signal.

33. A computer-readable tangible medium including instructions executable by a processor to cause the processor to:
generate a differential oscillator signal comprising first and second input signals;
provide a differential inphase (I) local oscillator (LO) signal comprising first and third output signals and a differential quadrature (Q) LO signal comprising second and fourth output signals, the differential I LO signal and the differential Q LO signal provided to a polyphase filter comprising first, second, third and fourth paths, each path comprising an inductor coupled to a resistor, wherein the first input signal is applied to the first and second paths and the second input signal is applied to the third and fourth paths, and wherein the first, second, third and fourth output signals are provided by the first, second, third and fourth paths, respectively;
perform frequency conversion between radio frequency (RF) and baseband with the differential I LO signal; and
perform frequency conversion between RF and baseband with the differential Q LO signal.

* * * * *